(12) United States Patent
Saukko et al.

(10) Patent No.: US 10,908,742 B2
(45) Date of Patent: Feb. 2, 2021

(54) DEVICE WITH GROOVES IN CONDUCTIVE CASING

(71) Applicant: Microsoft Technology Licensing, LLC, Redmond, WA (US)

(72) Inventors: Jari Saukko, Tampere (FI); Joni Arola, Tampere (FI); Pertti Husu, Tampere (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 40 days.

(21) Appl. No.: 14/918,988

(22) Filed: Oct. 21, 2015

(65) Prior Publication Data

US 2017/0115766 A1    Apr. 27, 2017

(51) Int. Cl.
*G06F 3/044* (2006.01)
*G06F 3/041* (2006.01)
(Continued)

(52) U.S. Cl.
CPC .............. *G06F 3/044* (2013.01); *G06F 1/169* (2013.01); *G06F 1/1626* (2013.01);
(Continued)

(58) Field of Classification Search
CPC ...... G06F 3/044; G06F 1/1626; G06F 1/1671; G06F 1/169; G06F 3/03547;
(Continued)

(56) References Cited

U.S. PATENT DOCUMENTS

| 3,728,509 A | 4/1973 | Shimojo |
| 5,311,656 A | 5/1994 | Eldershaw |

(Continued)

FOREIGN PATENT DOCUMENTS

| CN | 105339878 A | 2/2016 |
| EP | 2276109 A1 | 1/2011 |

(Continued)

OTHER PUBLICATIONS

"International Search Report and Written Opinion Issued in PCT Application No. PCT/US2016/056701", dated Jan. 24, 2017, 12 Pages.

(Continued)

*Primary Examiner* — Amare Mengistu
*Assistant Examiner* — Crystal Mathews (57) ABSTRACT

A device is provided. The device comprises a conductive element comprising one or more grooves, a capacitive field measurement element coupled to the conductive element, and a controller coupled to the capacitive field measurement element. The grooves comprise material with conductivity lower than the conductivity of the conductive element. The capacitive field measurement element is configured to measure change in the capacitive field in proximity of the grooves caused by physical interaction or proximity between the grooves and an external object, and provide the measurement to the controller. The controller is configured to trigger at least one function assigned to the one or more grooves when a change in the capacitive field in proximity of the one or more grooves is measured. Methods of operation and manufacture are also presented.

20 Claims, 4 Drawing Sheets (51) Int. Cl.
  *H03K 17/955* (2006.01)
  *G06F 1/16* (2006.01)
  *G06F 3/0354* (2013.01)
  *H03K 17/96* (2006.01)

(52) U.S. Cl.
  CPC ........ *G06F 1/1671* (2013.01); *G06F 3/03547* (2013.01); *G06F 3/0416* (2013.01); *H03K 17/955* (2013.01); *H03K 17/9622* (2013.01); *G06F 2203/0339* (2013.01); *G06F 2203/04108* (2013.01)

(58) Field of Classification Search
  CPC ........... G06F 3/0416; G06F 2203/0339; G06F 2203/04108; H03K 17/955
  See application file for complete search history.

(56) References Cited

U.S. PATENT DOCUMENTS

| | | | |
|---|---|---|---|
| 6,369,330 B2 | 4/2002 | Chou | |
| 6,912,280 B2 | 6/2005 | Henry | |
| 7,498,537 B1 | 3/2009 | Duwel | |
| 7,884,299 B2 | 2/2011 | Glew | |
| 8,450,627 B2 | 5/2013 | Mittleman et al. | |
| 8,872,771 B2 | 10/2014 | Hotelling et al. | |
| 2006/0278444 A1 | 12/2006 | Binstead | |
| 2008/0174321 A1* | 7/2008 | Kang | G06F 3/044 324/686 |
| 2008/0205714 A1* | 8/2008 | Benkley | G06F 3/03547 382/126 |
| 2008/0232049 A1* | 9/2008 | Takizawa | G06F 1/1601 361/679.01 |
| 2008/0314725 A1* | 12/2008 | Karhiniemi | G06F 3/044 200/600 |
| 2009/0033636 A1* | 2/2009 | Toyota | G06F 3/044 345/174 |
| 2009/0135157 A1* | 5/2009 | Harley | G06F 3/044 345/174 |
| 2009/0189875 A1* | 7/2009 | Ma | G06F 3/0416 345/174 |
| 2010/0248822 A1* | 9/2010 | Migos | A63F 13/06 463/29 |
| 2010/0315356 A1* | 12/2010 | Ferren | G06F 1/169 345/173 |
| 2011/0012793 A1* | 1/2011 | Amm | H01Q 1/243 343/702 |
| 2011/0062971 A1* | 3/2011 | Badaye | G06F 3/044 324/686 |
| 2011/0232976 A1* | 9/2011 | Osoinach | G06F 3/0418 178/18.06 |
| 2011/0286156 A1* | 11/2011 | Beecher | B06B 1/0292 361/679.01 |
| 2012/0075243 A1* | 3/2012 | Doi | G06F 3/044 345/174 |
| 2012/0199459 A1 | 8/2012 | Reise | |
| 2012/0214412 A1 | 8/2012 | Schlub et al. | |
| 2012/0217982 A1* | 8/2012 | Narayanasamy | H03K 17/962 324/686 |
| 2012/0256854 A1* | 10/2012 | Lee | G06F 1/1643 345/173 |
| 2012/0262407 A1* | 10/2012 | Hinckley | G06F 3/038 345/173 |
| 2012/0268145 A1* | 10/2012 | Chandra | G06F 3/044 324/686 |
| 2012/0329524 A1* | 12/2012 | Kent | G06F 3/044 455/566 |
| 2013/0093500 A1 | 4/2013 | Bruwer | |
| 2013/0135157 A1* | 5/2013 | Tsou | H01Q 1/2266 343/702 |
| 2013/0234734 A1* | 9/2013 | Iida | G06F 3/044 324/661 |
| 2013/0285982 A1* | 10/2013 | Graumann | G06F 3/044 345/174 |
| 2013/0300668 A1* | 11/2013 | Churikov | G06F 3/041 345/168 |
| 2014/0002362 A1 | 1/2014 | Srivastava | |
| 2014/0055369 A1* | 2/2014 | Li | G06F 3/0488 345/173 |
| 2014/0111653 A1 | 4/2014 | Willemenot De Nanc | |
| 2014/0111953 A1 | 4/2014 | Mcclure et al. | |
| 2014/0191420 A1 | 7/2014 | Chuah | |
| 2014/0218330 A1* | 8/2014 | Ady | H03K 17/962 345/174 |
| 2014/0327614 A1* | 11/2014 | Park | G06F 3/03547 345/157 |
| 2014/0354577 A1 | 12/2014 | Hanssen et al. | |
| 2014/0354587 A1* | 12/2014 | Mohindra | G06F 3/044 345/174 |
| 2015/0138701 A1* | 5/2015 | Sikka | G06F 1/1626 361/679.3 |
| 2015/0171916 A1 | 6/2015 | Asrani et al. | |
| 2016/0062515 A1* | 3/2016 | Bae | G06F 3/0414 345/174 |
| 2016/0216801 A1* | 7/2016 | Shedletsky | G06F 3/044 |
| 2016/0246396 A1* | 8/2016 | Dickinson | G06F 3/03545 |
| 2017/0038877 A1* | 2/2017 | Kuboyama | G06F 3/0414 |
| 2017/0102739 A1* | 4/2017 | Zaloom | G06F 1/1656 |
| 2017/0115767 A1* | 4/2017 | Arola | G06F 3/044 |

FOREIGN PATENT DOCUMENTS

| | | |
|---|---|---|
| EP | 2804320 A2 | 11/2014 |
| WO | 2015030870 A1 | 3/2015 |

OTHER PUBLICATIONS

"How Does this Button Work Without any Circuit Closing Device?", Jul. 10, 2015, Available at: http://electronics.stackexchange.com/questions/177196/how-does-this-button-work-without-any-circuit-closing-device.

"Second Written Opinion Issued in PCT Application No. PCT/US2016/056701", dated Aug. 29, 2017, 10 Pages.

"International Preliminary Report on Patentability Issued in PCT Application No. PCT/US2016/056701", dated Jan. 30, 2018, 10 Pages.

"Office Action Issued in European Patent Application No. 16790473.9", dated Apr. 16, 2020, 6 Pages.

"First Office Action Issued in Chinese Patent Application No. 201680062038.9", dated Sep. 25, 2020, 11 Pages.

* cited by examiner

DEVICE WITH GROOVES IN CONDUCTIVE CASING

BACKGROUND

Physical buttons in modern portable devices can serve various purposes, such as volume control, multimedia functions, screen lock and others. Usually in devices with touch screens, the side buttons serve a secondary purpose and are positioned around the edges of the device. The side keys are usually coupled to the printed circuit board (PCB) in order to perform their functions. The mechanical buttons or keys provide a tactile feedback different from a touch surface, so in some cases they can be preferable—cases like when a user cannot see the display of the device but wishes to give quick commands, for example change volume while the mobile phone is in the pocket.

SUMMARY

The following presents a simplified summary of the disclosure in order to provide a basic understanding to the reader. This summary is not an extensive overview of the disclosure and it does not identify key/critical elements or delineate the scope of the specification. Its sole purpose is to present a selection of concepts disclosed herein in a simplified form as a prelude to the more detailed description that is presented later.

A device with conductive elements that have grooves is presented. Areas around the grooves can be used as button areas, and a capacitive field measurement element monitors if a press has been made. Then the information is given to a controller, which triggers the predetermined functions. Variants of structural implementation of grooves and conductive cases are presented. Methods for operating and assembling the device are also presented.

Many of the attendant features will be more readily appreciated, as the same becomes better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

The detailed description provided below in connection with the appended drawings is intended as a description of the present embodiments and is not intended to represent the only forms in which the present invention may be constructed or utilized. However, the same or equivalent functions and sequences may be accomplished by different embodiments.

The embodiments described below are not limited to implementations which solve any or all of the disadvantages of known devices with mechanical side buttons. Although the present examples are described and illustrated herein as being implemented in flat portable electronic devices, the devices described are provided as an example and not a limitation. As those skilled in the art will appreciate, the presented embodiments are suitable for application in a variety of electronic devices with capacitance measurement functionality.

The embodiments described below are partially based on the concept of capacitance measurement of conductive material with non-conductive grooves cut out in it, wherein the grooves create "gaps" in the conductive material. Changes in capacitance of the area around the grooves can be monitored and used for identification of press by an external object. To a user, the device on the outside may appear as a portable device with mechanical pressing regions in groove areas which can have reconfigurable functions. However, a direct connection between the grooves and the circuitry of the device such as the PCB is not necessary because the detection of a "press" of the key is performed at least in part by capacitive field measurement, as described below.

Figure 1A:
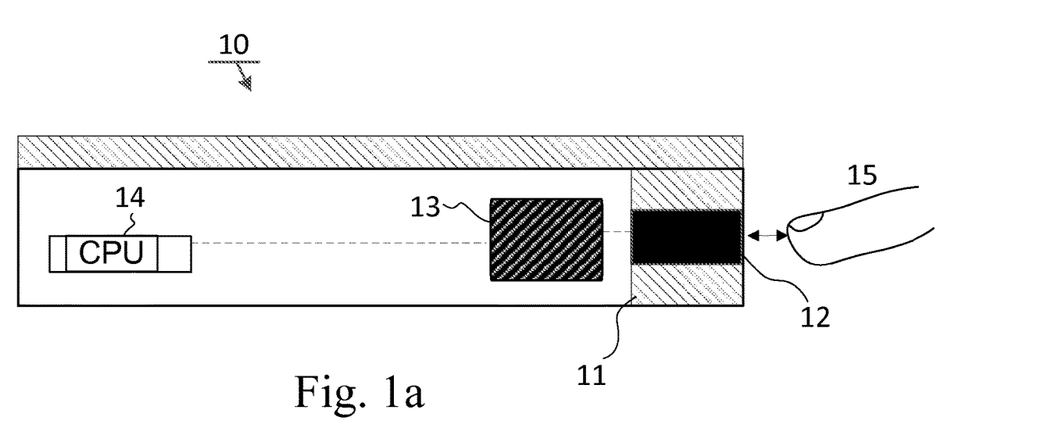
FIG. 1a is a schematic side view of a device according to an embodiment.

FIG. 1a is a schematic illustration of a portable device 10 according to an embodiment. The blocks on this illustration are not meant to represent absolute or relative dimensions of any of the elements of the device 10. The device 10 comprises a conductive element 11 which in turn comprises one or more grooves 12. In FIG. 1a the device 10 is shown to have one groove 12 in the conductive element 11 which is positioned on the side of the device 10. The groove 12 is schematically shown to split the conductive element 11. The device further comprises a capacitive field measurement element 13 coupled to the conductive element 11, and a controller 14 coupled to the capacitive field measurement element 13. The connections are shown by dashed lines in FIG. 1a.

The groove 12 comprises material with conductivity lower than the conductivity of the conductive element 11. The conductivity of the material in the grooves 12 needs to be sufficiently lower than the conductivity of the rest of the conductive element 11 for efficient identification of change in capacitance field around the area. In an embodiment, the grooves 12 may be filled with air. The capacitive field measurement element 13 is configured to measure change in the capacitive field in proximity of the one or more grooves caused by physical interaction or proximity between the one or more grooves and an external object 15, and provides the measurement to the controller 14. The controller 14 then triggers at least one function when a change in the capacitive field in proximity of the one or more grooves 12 is measured. The function may be predefined, assigned by the user or by the application software running on the device. Complex functions may be triggered based on the change in capacitive field in proximity of the one or more grooves 12. If the device 10 comprises more than one groove 12, the controller 14 may also be configured to trigger additional functions if an object 15 interacts with two or more of the grooves 12. The controller 14 may also be configured to prevent triggering of any functions if an object 15 is detected in proximity of two or more grooves 12. For example if a user holds a handheld device and a grip is detected, individual functions of particular regions will not be triggered.

In an embodiment, the one or more grooves 12 comprise non-conductive material, for example a polymer or plastic non-conductive material. According to an embodiment, the conductive element 11 comprises metal. The metal can be, for example, aluminum or steel. These embodiments provide an effect on capacitive field sensing capabilities due to a large "contrast" between the conductivity of the two elements 11 and 12.

In an embodiment, the grooves 12 are cut out through the conductive element 11. The grooves 12 that go through the body of the conductive element 11 can be positioned such that the conductive element is separated by the grooves, and for example the non-conductive material of the grooves 12 extend towards the capacitive field measurement element 13. This has a technical effect of increased precision of capacitance field measurement by the element 13. In an embodiment, the grooves 12 are positioned in immediate proximity of the capacitive field measurement element 13 to further increase the precision.

Figure 1B:
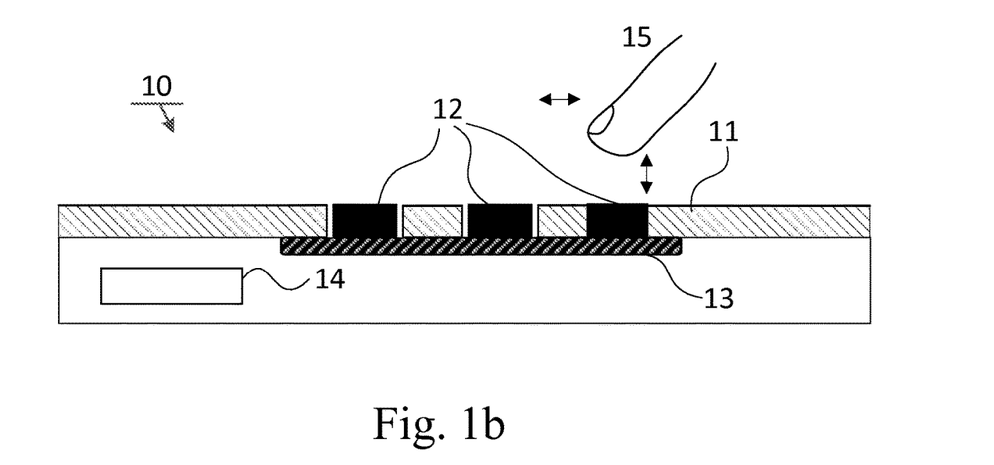
FIG. 1b is a schematic side view of a device according to an alternative embodiment.

The capacitive field measurement element 13 can be a standalone element as shown in FIGS. 1a and 1b. In an alternative embodiment, the device 10 comprises a touch sensing element, for example a capacitive touch screen or touch surface; and the element 13 may be fully integrated in the touch sensing element.

In an embodiment, the device 10 may comprise wires at the edges between the conductive element and the capacitive field measurement element 13. The wires are not shown as being comparatively small. In the embodiment, the capacitive field measurement element 13 is positioned next to the and near the edge.

FIG. 1b shows an embodiment with a row of three grooves 12 filled with non-conductive material. In an embodiment, the grooves 12 include mechanical keys. According to an embodiment, the mechanical keys comprise the same material comprised in the grooves 12. In an alternative embodiment, the keys comprise conductive material, for a metal ring or element of another shape. In this embodiment, the conductive material of the mechanical keys should be positioned such that it is surrounded with non-conductive or low conductivity material in the grooves 12. This could be achieved by embedding the conductive material into the remaining material of the grooves 12. The embodiment provides increased sensitivity to capacitance changes.

The field measurement element 13 is configured to measure change in the capacitive field in proximity of the at least one groove 12 caused by a press by an external object 15. In an embodiment, the grooves 12 are positioned in at least one row, and the row of grooves 12 forms a slider element. This element 12 is also shown on FIG. 2. The sliding along multiple grooves 12 in a row can provide for accurate input when sliding is preferred to normal push of the buttons, for example in multimedia or volume control.

In an embodiment, the device 10 also comprises a memory coupled to the controller 14, wherein the memory is configured to store at least one function assigned to capacitance change detection. The controller 14 can then be configured to request and/or retrieve the function currently assigned to a particular area in proximity of a groove 12 prior to carrying out the function. As it is clear to a skilled person, the device 10 according to the embodiments is not limited by placement of a display or other modules, and the device 10 can be reconfigured with grooves 12 cut out on the sides, top or bottom of the device 10.

Figure 1C:
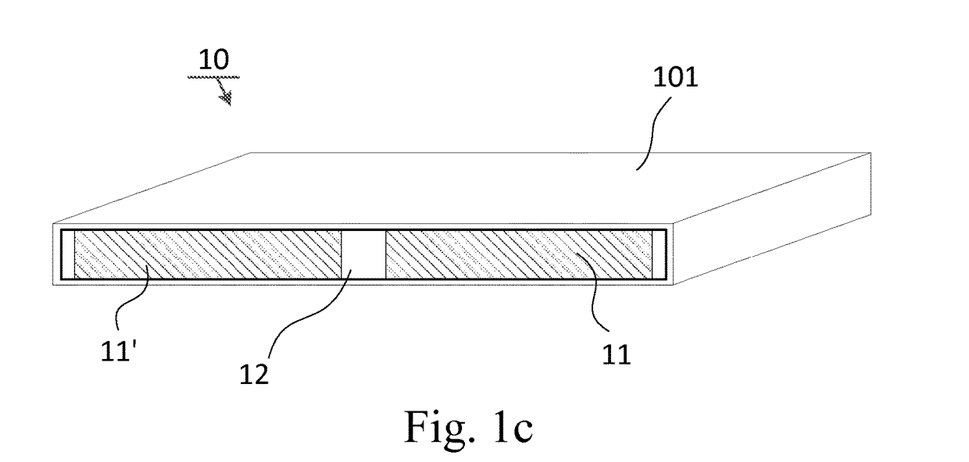
FIG. 1c is a schematic side angled view of a device according to an embodiment.

FIG. 1c shows an angled view of the device 10. This Figure illustrates an embodiment where two or more conductive stripes 11, 11' are attached to the non-conductive casing 101, and the groove 12 is cut out in one of the stripes 11, 11' and comprises non-conducting material of the underlying non-conductive casing 101, which is part of the device 10. In this embodiment, in contrast to fully conductive (for example, metal) casing of the device, the non-conductive casing with e.g. metal stripes or other conductive bands 11, 11' can be more cost efficient. The elements 11, 11' can also represent the conductive paint sprayed over the non-conductive casing, with one or more grooves 12 carved in the conductive paint.

The groove 12 shown on FIG. 1c can house a mechanical key, not shown. The mechanical key may be implemented as a movable part of the non-conductive material of the casing 101. In an embodiment, the device 10 comprises a press detection element coupled to the controller 14, wherein the press detection element is configured to detect that the mechanical key is fully pressed, and the controller 14 is configured to trigger an additional function upon detection that the mechanical key is fully pressed.

According to an embodiment, the device 10 has a prolonged shape in the horizontal plane, and substantially thin vertically, as schematically shown in FIG. 1c. One or more grooves 12 are positioned at one or more edges of the device, and the thickness of the device 10 at the edges can be between 0.3 and 3 millimeters. This thin quality can be provided due to grooves 12 taking less space than the non-necessary mechanical keys, and due to the independence from a circuit board connection. As it is clear to a skilled person, any other thickness of the device 10 at the edges, or characteristic size of the conductive element 11 and the grooves 12, is possible in other embodiments.

In an embodiment, the device 10 comprises a feedback element configured to provide feedback to a user of the device 10 in response to physical interaction between the one or more grooves 12 and a finger. The feedback may vary from tactile feedback, visual display on the User Interface (UI) of the device, visual confirmation using small light emitting diodes, audio confirmations and other feedback.

Figure 2:
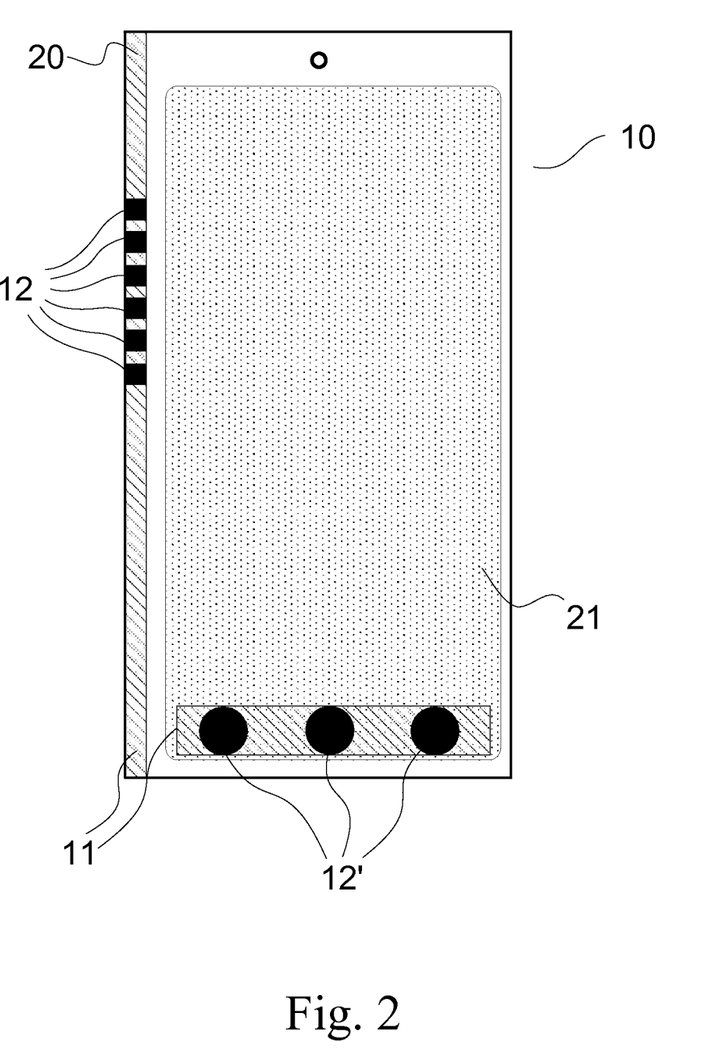
FIG. 2 is a top view of a device according to an embodiment.

FIG. 2 shows an exemplary embodiment wherein the device 10 is implemented as a handheld electronic device. In the embodiment shown on FIG. 2, the conductive element 11 comprises a casing 20 of the device, and the grooves 12, 12' are cut out in the conductive casing. The grooves 12' are cut out through the element 11 vertically, so that there is no conductive material between the grooves 12' and the touch screen 21, which comprises the capacitive field measurement element. The device 10 also comprises a touch screen 21 coupled to the conductive element 11, wherein the casing 20 supports the touch sensing element 21 at least at two edges (in this case at all four edges), and the grooves 12 are cut out in the casing 20 in proximity of the touch screen 21. In an embodiment, the cut out of the grooves 12 may be done in such a way that there is no conductive material or space between the touch screen 21 and the groove 12 for improved isolation. The grooves 12 are shown as an array, as discussed earlier, and can be used both individually as a pressing region and together as a slider. The grooves 12' can comprise regular phone keys or keys that change functionality depending on the operating system and/or current applications on the device 10.

The grooves 12, the areas between the grooves 12 and in some embodiments the mechanical keys in the grooves can be of any shape or length, and provide tactile feedback to a user if pressed with a finger.

The controller 14 can comprise a processor (CPU on the figure) according to an embodiment.

The above embodiments provide a technical effect of free placement of keys and grooves 12, across the body of the device 10. The placement does not depend on direct connection of these elements to the Printed Circuit Board (PCB) and therefore it allows more flexibility in the design of portable devices 10. In thin devices, the placement of PCB can be quite restrictive, so the additional placement options provided by the above embodiments can be useful in portable electronic devices.

Devices according to any of the above embodiments can be used in portable electronic devices such as mobile phones, tablets, foldable laptop computers, e-readers and other devices with metal parts; and the grooves provided in the conductive part can be used as mechanical pressing regions with capacitive field measurement regardless of conductivity of the external object. The devices may be embedded in or attached to an electronic system.

Figure 3:
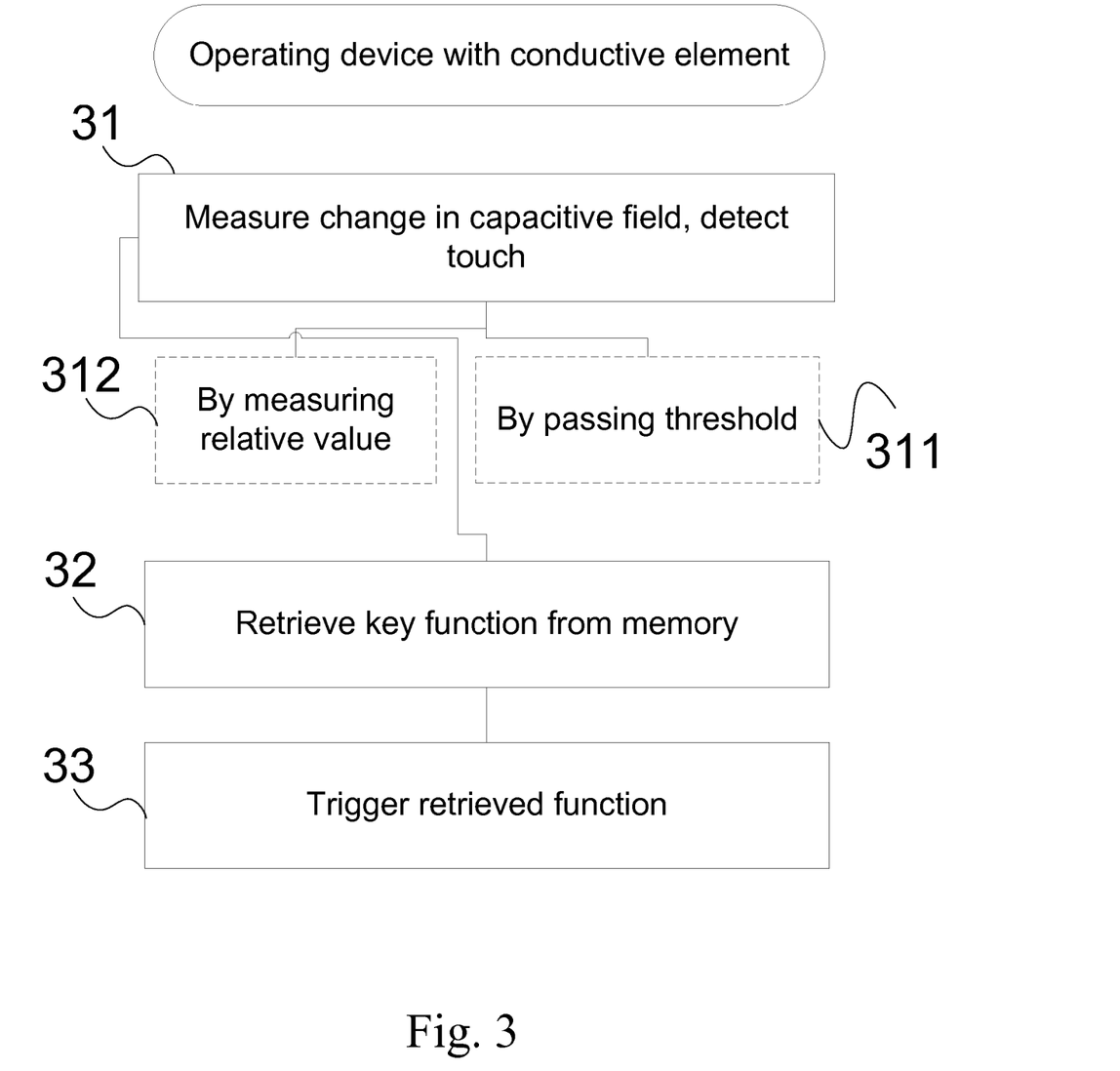
FIG. 3 is a flow chart of a method according to an embodiment.

FIG. 3 is a flow chart for a method of operating a device according to any of the above embodiments. The method can be performed e.g. by the controller of the device. The method comprises 31 measuring change in the capacitive field in proximity of the one or more grooves caused by physical interaction or proximity between the one or more grooves and an external object. This measurement 31 can be ordered by the controller and actually performed by a capacitive field measurement element, and can be a continuous measurement. In an embodiment, the measurement 31 can be done by detecting 311 when the value of capacitance (or any other related parameter) of the capacitive field in proximity of the one or more grooves exceeds a predetermined threshold. In an alternative embodiment, the measurement 31 is performed by monitoring 312 the relative value of capacitance of the capacitive field in proximity of the one or more grooves.

The method also comprises retrieving 32 a function from the memory associated with change in the capacitive field in proximity of the one or more grooves, and triggering 33 the retrieved function when the change in the capacitive field in proximity of the one or more grooves is measured.

Figure 4:
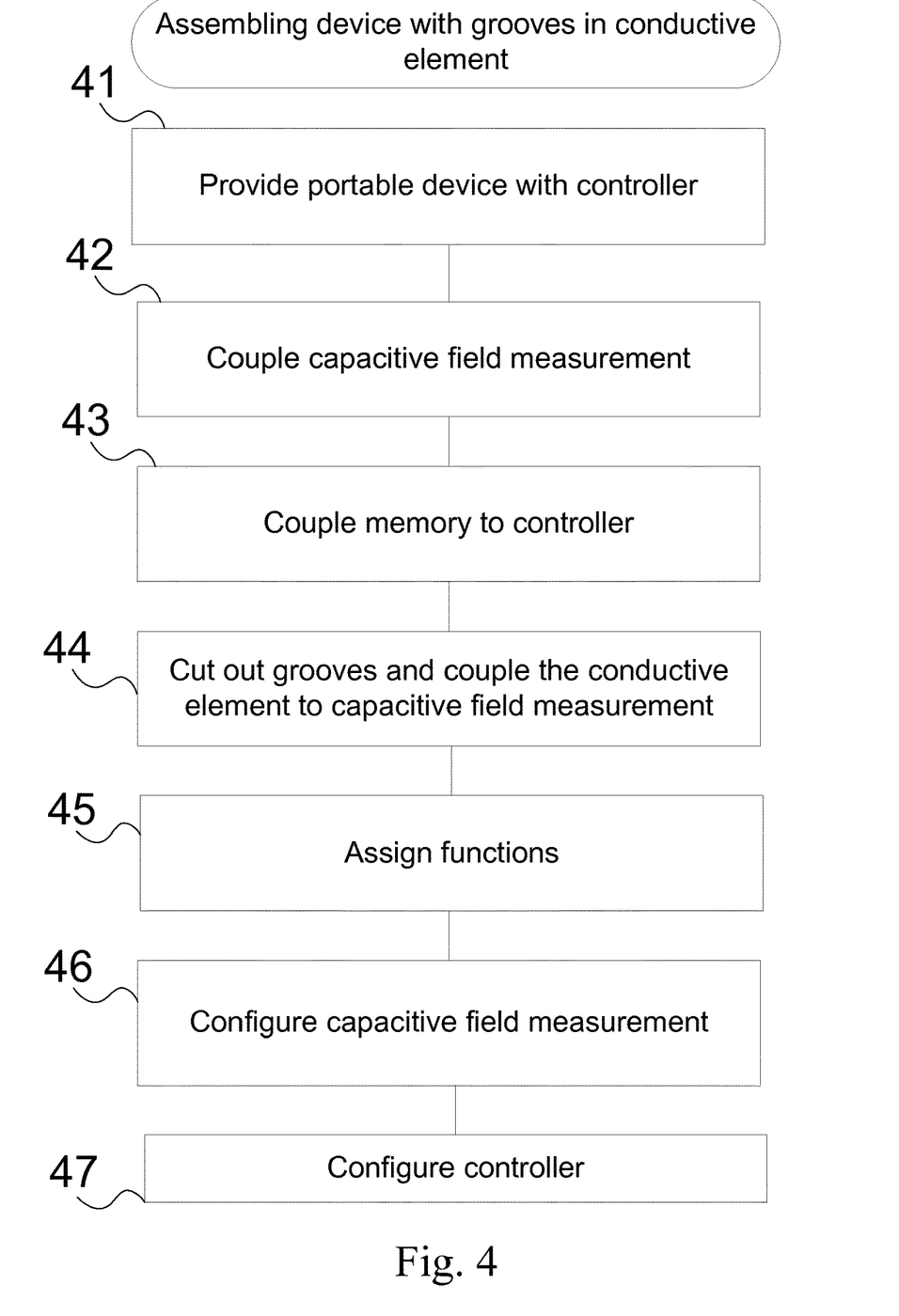
FIG. 4 is a flow chart of an assembly method according to an embodiment.

FIG. 4 is a flow chart for a method according to an aspect. The method can be a method for assembling or manufacturing a device comprising a conductive element and touch sensing. The method comprises providing 41 a portable device comprising a controller; coupling 42 the capacitive field measurement element to the controller; coupling 43 a memory to the controller. The method also comprises cutting out 44 one or more grooves in a conductive element, and coupling the conductive element to the capacitive field measurement element so that the grooves comprise material with conductivity lower than the conductivity of the conductive element. Then, at least one function associated with change in capacitive field in proximity of the one or more grooves is assigned 45: and the assigned function is stored in the memory. The capacitance measurement element is configured 46 to measure change in capacitance field in proximity to the one or more grooves caused by proximity or physical interaction between the grooves and an external object; and finally the controller is configured 47 to trigger the at least one assigned function assigned when change in the capacitive field in proximity of the one or more grooves is measured.

The methods described above can have an effect on simple assembly of a thin portable device with grooves and areas close to the grooves acting as side keys wherein direct contact of any mechanical keys with the circuitry is not necessary.

The steps of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other examples described to form further examples without losing the effect sought.

The methods described herein may be performed by software in machine readable form on a tangible storage medium e.g. in the form of a computer program comprising computer program code means adapted to perform all the steps of any of the methods described herein when the program is run on a computer and where the computer program may be embodied on a computer readable medium. Examples of tangible storage media include computer storage devices comprising computer-readable media such as disks, thumb drives, memory etc. and do not include propagated signals. Propagated signals may be present in a tangible storage media, but propagated signals per se are not examples of tangible storage media. The software can be suitable for execution on a parallel processor or a serial processor such that the method steps may be carried out in any suitable order, or simultaneously.

According to an aspect, a device is presented. The device comprises: a conductive element comprising one or more grooves, a capacitive field measurement element coupled to the conductive element, and a controller coupled to the capacitive field measurement element. The one or more grooves comprise material with conductivity lower than the conductivity of the conductive element; the capacitive field measurement element is configured to measure change in the capacitive field in proximity of the one or more grooves caused by physical interaction or proximity between the one or more grooves and an external object, and provide the measurement to the controller; and the controller is configured to trigger at least one function when a change in the capacitive field in proximity of the one or more grooves is measured.

In an embodiment, the one or more grooves comprise non-conductive material.

In an embodiment, alternatively or in addition to the above embodiments, the conductive element comprises metal.

In an embodiment, alternatively or in addition to the above embodiments, one or more grooves are cut out through the conductive element.

In an embodiment, alternatively or in addition to the above embodiments, the conductive element comprises a casing of the device, and the device comprises a capacitive touch screen coupled to the conductive element. In the embodiment, the casing supports the touch sensing element at least at two edges, and the one or more grooves are cut out in the casing in proximity of the touch screen.

In an embodiment, alternatively or in addition to the above embodiments, the device has a prolonged shape in the horizontal plane, the one or more grooves are positioned at one or more edges of the device, and the thickness of the device at the edges is between 0.3 and 3 millimeters.

In an embodiment, alternatively or in addition to the above embodiments, the device comprises two or more grooves positioned in a row, wherein the row of grooves forms a slider element.

In an embodiment, alternatively or in addition to the above embodiments, at least one groove houses a mechanical key comprising non-conductive material, and the capacitive field measurement element is configured to measure change in the capacitive field in proximity of the at least one groove caused by a press of the mechanical key.

In an embodiment, alternatively or in addition to the above embodiments, the device comprises a press detection element coupled to the controller, wherein the press detection element is configured to detect that the mechanical key is fully pressed, and the controller is configured to trigger a secondary function upon detection that the mechanical key is fully pressed.

In an embodiment, in addition to the above embodiment, the mechanical key also comprises conductive material insulated from the outer parts of the groove by the non-conductive material.

In an embodiment, alternatively or in addition to the above embodiments, the device comprises a memory coupled to the controller, wherein the memory is configured to store at least one function associated with change in the capacitive field in proximity of the one or more grooves.

In an embodiment, alternatively or in addition to the above embodiments, the device comprises a feedback element configured to provide feedback to a user of the device in response to physical interaction between the one or more grooves and a finger.

In an embodiment, alternatively or in addition to the above embodiments, the device comprises a non-conductive casing, wherein the conductive element comprises one or more conductive stripes attached to the non-conductive casing, and the one or more grooves are cut out in the one or more stripes and comprise non-conducting material of the underlying non-conductive casing.

In an embodiment, alternatively or in addition to the above embodiments, the device comprises a non-conductive casing. In the embodiment, the conductive element comprises conductive paint sprayed over to the non-conductive casing, and the one or more grooves are cut out in the conductive paint, and comprise non-conducting material of the underlying non-conductive casing.

In an embodiment, alternatively or in addition to the above embodiments, the device is implemented as a hand-held electronic device.

According to an aspect, a method is presented. The method is a method of operating a device which comprises a conductive element comprising one or more grooves, a capacitive field measurement element coupled to the conductive element, a memory and a controller coupled to the capacitive field measurement element and the memory. The method comprises: measuring change in the capacitive field in proximity of the one or more grooves caused by physical interaction or proximity between the one or more grooves and an external object; retrieving from the memory a function associated with change in the capacitive field in proximity of the one or more grooves; and triggering the retrieved function when the change in the capacitive field in proximity of the one or more grooves is measured.

In an embodiment, measuring change in the capacitive field in proximity of the one or more grooves comprises detecting when the value of capacitance of the capacitive field in proximity of the one or more grooves exceeds a predetermined threshold.

In an embodiment, alternatively or in addition to the above embodiments, measuring change in the capacitive field in proximity of the one or more grooves comprises monitoring the relative value of capacitance of the capacitive field in proximity of the one or more grooves.

In an embodiment, alternatively or in addition to the above embodiments, the method comprises retrieving from the memory a primary function and a secondary function associated with change in the capacitive field in proximity of the one or more grooves; triggering the retrieved primary function when a change in the capacitive field in proximity of the one or more grooves is caused by proximity of an external object; and triggering the retrieved secondary function when a change in the capacitive field in proximity of the one or more grooves is caused by physical interaction between the one or more grooves and the external object.

According to an aspect, a method is presented. The method comprises: providing a portable device comprising a controller; coupling a capacitive field measurement element to the controller; coupling a memory to the controller; cutting out one or more grooves in a conductive element; coupling the conductive element to the capacitive field measurement element so that the grooves comprise material with conductivity lower than the conductivity of the conductive element; assigning at least one function associated with change in capacitive field in proximity of the one or more grooves and storing the assigned function in the memory; configuring the capacitive field measurement element to measure change in capacitive field in proximity to the one or more grooves caused by proximity or physical interaction between the one or more grooves and an external object; and configuring the controller to trigger the at least one assigned function when change in the capacitive field in proximity of the one or more grooves is measured.

Any range or device value given herein may be extended or altered without losing the effect sought, as will be apparent to the skilled person.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the technical effects described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The term 'comprising' is used herein to mean including the method blocks or elements identified, but that such blocks or elements do not comprise an exclusive list and a method or device may contain additional blocks or elements.

It will be understood that the above description is given by way of example only and that various modifications may be made by those skilled in the art. The above specification, embodiments and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. A device comprising:
   a touch screen located on a first planar surface, the touch screen comprising a capacitive field measurement element;
   an edge portion located on a second planar surface that is perpendicular to the touch screen;
   a conductive element comprising one or more non-conductive grooves located on the edge portion, wherein the conductive element has a first external surface that is in a same plane as the second planar surface, and wherein the conductive element is coupled to the capacitive field measurement element;

a controller coupled to the capacitive field measurement element, wherein:
  physical interaction between the one or more non-conductive grooves and an external object causes a capacitive field change in proximity of the one or more non-conductive grooves,
  the capacitive field measurement element is configured to measure the capacitive field change and provide the measurement of the capacitive field change to the controller,
  the controller is configured to trigger at least one function upon the measurement of the capacitive field change exceeding a threshold,
  the controller is further configured to prevent a triggering of the at least one function upon detecting a grip of a user holding the device; and
at least one moveable mechanical key disposed within at least one of the one or more non-conductive grooves, the at least one moveable mechanical key having a second external surface that is in the same plane as the first external surface and the second planar surface, wherein:
  a corresponding groove comprises a same material as the at least one moveable mechanical key,
  the least one moveable mechanical key is decoupled from the capacitive field measurement element,
  the least one moveable mechanical key is decoupled from the controller, and
  actuation of the least one moveable mechanical key provides tactile feedback to the user.

2. A device as claimed in claim 1, wherein the conductive element comprises metal.

3. A device as claimed in claim 1, wherein the one or more non-conductive grooves are cut out through the conductive element.

4. A device as claimed in claim 1, wherein the touch screen is coupled to the conductive element, wherein:
  a casing supports a touch sensing element at least at two edges.

5. A device as claimed in claim 1, wherein
the device has a prolonged shape in a horizontal plane,
the one or more non-conductive grooves are positioned at one or more edges of the device, and
a thickness of the device at the edges is between 0.3 and 3 millimeters.

6. A device as claimed in claim 1 comprising two or more grooves positioned in a row, wherein the two or more grooves in the row forms a slider element.

7. A device as claimed in claim 1, comprising a memory coupled to the controller, wherein the memory is configured to store at least one function associated with change in the capacitive field in proximity of the one or more non-conductive grooves.

8. A device as claimed in claim 1 comprising a feedback element configured to provide feedback to the user of the device in response to physical interaction between the one or more non-conductive grooves and a finger.

9. A device as claimed in claim 1 wherein a casing is a non-conductive casing, and wherein
the conductive element comprises one or more conductive stripes attached to the non-conductive casing, and
the one or more non-conductive grooves are cut out in the one or more stripes and comprise non-conducting material of the non-conductive casing.

10. A device as claimed in claim 1 wherein a casing is a non-conductive casing, and wherein
the conductive element comprises conductive paint sprayed over to the non-conductive casing, and
the one or more non-conductive grooves are cut out in the conductive paint and comprise non-conducting material of the non-conductive casing.

11. A device as claimed in claim 1, implemented as a handheld electronic device.

12. A method of operating a device which comprises a conductive element comprising one or more non-conductive grooves located on an edge portion planar surface, the conductive element having a first external surface that is in a same plane as the edge portion planar surface, a touch screen located on another planar surface that is perpendicular to the edge portion planar surface comprising a capacitive field measurement element coupled to the conductive element, a memory, and a controller coupled to the capacitive field measurement element and the memory;
wherein the method comprises:
  measuring change in a capacitive field in proximity of the one or more non-conductive grooves caused by physical interaction between the one or more non-conductive grooves and an external object;
  storing in the memory a function that triggers upon detection of the measured change in the capacitive field in proximity of the one or more non-conductive grooves;
  preventing the triggering of the stored function upon detecting a grip of a user holding the device; and
  providing tactile feedback upon actuation of at least one moveable mechanical key disposed within at least one of the one or more non-conductive grooves, the at least one moveable mechanical key having a second external surface that is in the same plane as the first external surface and the edge portion planar surface wherein:
    a corresponding groove comprises a same material as the at least one moveable mechanical key,
    the least one moveable mechanical key is decoupled from the capacitive field measurement element, and
    the least one moveable mechanical key is decoupled from the controller.

13. A method as claimed in claim 12, wherein measuring change in the capacitive field in proximity of the one or more non-conductive grooves comprises detecting when a value of capacitance of the capacitive field in proximity of the one or more non-conductive grooves exceeds a threshold.

14. A method as claimed in claim 12, wherein measuring change in the capacitive field in proximity of the one or more non-conductive grooves comprises monitoring a relative value of capacitance of the capacitive field in proximity of the one or more non-conductive grooves.

15. A method as claimed in claim 12, wherein the preventing the triggering comprises: preventing the triggering of a primary function and a secondary function.

16. The method of claim 12 further comprising:
receiving slider input via two or more grooves positioned in a row to form a slider element.

17. The method of claim 12 further comprising:
providing, via a feedback element, feedback to the user of the device in response to physical interaction between the one or more non-conductive grooves and a finger.

18. A method comprising:

providing a portable device comprising a controller;

coupling a touch screen located on a planar surface comprising a capacitive field measurement element to the controller;

coupling a memory to the controller;

cutting out one or more non-conductive grooves in a conductive element of an edge portion located on another planar surface that is perpendicular to the touch screen comprising a casing of the portable device, the conductive element having a first external surface that is in a same plane as the another planar surface;

providing a least one moveable mechanical key within at least one of the one or more non-conductive grooves, the at least one moveable mechanical key having a second external surface that is in the same plane as the conductive element and the another planar surface coupling the conductive element to the capacitive field measurement element;

assigning at least one function associated with change in capacitive field in proximity of the one or more non-conductive grooves and storing the at least one assigned function in the memory;

configuring the controller to prevent the triggering of the at least one assigned function upon detection of a grip of a user holding the device; and providing tactile feedback upon actuation of at least one moveable mechanical key disposed within at least one of the one or more non-conductive grooves, wherein:

a corresponding groove comprises a same material as the at least one moveable mechanical key, the least one moveable mechanical key is decoupled from the capacitive field measurement element, and the least one moveable mechanical key is decoupled from the controller.

19. The method of claim 18, wherein the edge portion comprises less surface area than the touch screen.

20. The method of claim 18 further comprising:

receiving slider input via two or more grooves positioned in a row to form a slider element.

* * * * *